(12) United States Patent
Govil et al.

(10) Patent No.: US 6,509,952 B1
(45) Date of Patent: Jan. 21, 2003

(54) METHOD AND SYSTEM FOR SELECTIVE LINEWIDTH OPTIMIZATION DURING A LITHOGRAPHIC PROCESS

(75) Inventors: Pradeep Kumar Govil, Norwalk, CT (US); James Tsacoyeanes, Southbury, CT (US)

(73) Assignee: Silicon Valley Group, Inc., Wilton, CT (US)

( * ) Notice: Subject to any disclaimer, the term of this patent is extended or adjusted under 35 U.S.C. 154(b) by 0 days.

(21) Appl. No.: 09/575,997

(22) Filed: May 23, 2000

(51) Int. Cl.[7] .................. G03B 27/68; G03B 27/42; G03F 7/20
(52) U.S. Cl. ............... 355/52; 355/53; 355/55; 430/30
(58) Field of Search .................. 355/52, 53, 55; 430/5, 22, 30; 356/369, 399

(56) References Cited

U.S. PATENT DOCUMENTS

| | | | |
|---|---|---|---|
| 4,391,511 A | 7/1983 | Akiyama et al. ............. 355/40 |
| 4,475,223 A | 10/1984 | Taniguchi et al. ............ 378/34 |
| 4,504,144 A | 3/1985 | Trost .......................... 356/150 |
| 4,538,105 A | 8/1985 | Ausschnitt ................... 324/158 |
| 4,666,291 A | * 5/1987 | Taniguchi et al. ............ 355/52 |
| 4,693,569 A | 9/1987 | Offner ......................... 350/505 |
| 4,846,626 A | 7/1989 | Engelbrecht ................ 414/754 |
| 4,973,217 A | 11/1990 | Engelbrecht ................ 414/754 |
| 5,094,536 A | 3/1992 | MacDonald et al. ........ 356/358 |
| 5,202,748 A | 4/1993 | MacDonald et al. ........ 356/360 |
| 5,563,684 A | 10/1996 | Stagaman .................... 355/72 |
| 5,677,091 A | 10/1997 | Barr et al. .................... 430/5 |
| 5,724,122 A | 3/1998 | Oskotsky ..................... 285/67 |
| 5,756,238 A | * 5/1998 | Barr et al. ................... 356/400 |
| 5,767,523 A | 6/1998 | McCullough ............... 250/548 |
| 5,895,737 A | 4/1999 | McCullough et al. ........ 430/30 |
| 5,896,188 A | 4/1999 | McCullough ............... 355/67 |
| 5,920,396 A | 7/1999 | Markoya et al. ............ 356/400 |
| 6,007,968 A | * 12/1999 | Furukawa et al. ........... 430/313 |
| 6,137,578 A | * 10/2000 | Ausschnitt ................... 356/399 |
| 6,218,089 B1 | * 4/2001 | Pierrat ......................... 430/296 |

OTHER PUBLICATIONS

Copy of International Search Report for Application No. PCT/US01/15655, issued Dec. 11, 2001, 6 pages.

* cited by examiner

Primary Examiner—Alan A. Mathews
(74) Attorney, Agent, or Firm—Sterne, Kessler, Goldstein & Fox, P.L.L.C.

(57) ABSTRACT

Particular types of distortion within a lithographic system may be characterized by linewidth control parameters. Linewidth control parameters of any given line or feature within a printed pattern vary as a result of optical capabilities of the lithography apparatus used, particular characteristics of the reticle, focus setting, light dose fluctuations, etc. The instant invention uses focus offset coefficients to change the focus at points within a slot to compensate for the linewidth control parameter variations introduced by the factors contributing to such variations. Additionally, different focuses can be set dynamically along the scan for a particular slot point. A set, or sets, of focus offset coefficients is generated for a particular lithography apparatus, depending on the number of linewidth control parameters for which correction is desired.

15 Claims, 12 Drawing Sheets

METHOD AND SYSTEM FOR SELECTIVE LINEWIDTH OPTIMIZATION DURING A LITHOGRAPHIC PROCESS

This application is related to U.S. patent application Ser. No. 09/575,998, entitled "Flexible Piezoelectric Chuck and Method of Using the Same," filed May 23, 2000, the disclosure of which is hereby incorporated by reference in its entirety.

BACKGROUND OF THE INVENTION

1. Field of the Invention

This invention relates to an improved method of lithography. More particularly, this invention relates to a method of selective linewidth optimization of patterns on the surface of a substrate used during a lithography process.

2. Related Art

Lithography is a process used to create features on the surface of substrates. Such substrates can include those used in the manufacture of flat panel displays, circuit boards, various integrated circuits, and the like. A frequently used substrate for such applications is a semiconductor wafer. While this description is written in terms of a semiconductor wafer for illustrative purposes, one skilled in the art would recognize that this description also applies to other types of substrates known to those skilled in the art. During lithography, a wafer, which is disposed on a wafer stage, is exposed to an image projected onto the surface of the wafer by exposure optics located within a lithography apparatus. While exposure optics are used in the case of photolithography, a different type of exposure apparatus may be used depending on the particular application. For example, x-ray, ion, electron, or photon lithographies each may require a different exposure apparatus, as is known to those skilled in the art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove or further process exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time, individual fields are scanned onto the wafer one at a time. This is done by moving the wafer and reticle simultaneously such that the imaging slot is moved across the field during the scan. The wafer stage must then be asynchronously stepped between field exposures to allow multiple copies of the reticle pattern to be exposed over the wafer surface. In this manner, the quality of the image projected onto the wafer is maximized. While using a step-and-scan technique generally assists in improving overall image quality, image distortions generally occur in such systems due to imperfections within the projection optics system, illumination system, and the particular reticle being used.

One technique for improving image sharpness has been proposed by Stagaman (U.S. Pat. No. 5,563,684). Stagaman observes that a conventional approach for improving image sharpness is to use a deformable chuck that flattens the wafer surface in order to conform that surface to the focal plane of the lens used. However, Stagaman further observes that the actual image pattern associated with a lens can differ from the theoretical flat focal plane of the lens, and so flattening the wafer's surface will not necessarily improve pattern sharpness for a particular lens. Thus, Stagaman suggests an approach whereby the actual focal pattern of a lens is determined. A flexible chuck is then used to conform the surface of the wafer to the actual focal pattern of the lens, thereby improving average image sharpness. While this approach may prove satisfactory in some processing environments, the instant inventors have discovered that correcting for average image sharpness is not the best approach in many processing environments. Rather, a method for correcting for particular types of distortions is needed, since required device tolerances are related to specific factors and not necessarily to average image sharpness.

SUMMARY OF THE INVENTION

Particular types of distortion within a lithographic system may be characterized by linewidth control parameters. Linewidth control parameters of any given line or feature within a printed pattern vary as a result of optical capabilities of the lithography apparatus used, particular characteristics of the reticle, focus setting, light dose fluctuations, and the like. The instant invention uses focus offset coefficients to change the focus at points within a slot, like that discussed above, to compensate for the linewidth control parameter variations introduced by the factors contributing to such variations. A set, or sets, of focus offset coefficients is generated for a particular lithography apparatus, depending on the number of linewidth control parameters for which correction is desired.

The disclosed invention can be used for optimization of features other than lines, since linewidth control parameters can be used to characterize features other than lines (e.g., contacts and the like). Furthermore, while the instant invention is desribed in terms of optimizing linewidth control parameter through the use of focus offset coefficients, any type of systemic problem that can be compensated through the use of focus offsets is within the scope of this invention. For example, retical bi-refringence, dose control and illumination properties, and vibration are all systemic problems capable of compensation through the use of focus offset coefficients, and thus their compensation through the use of the method and system of the instant invention is within the scope of this disclosure.

In a preferred embodiment, the instant invention is a method of selective linewidth optimization within a lithographic system including the steps of selecting a linewidth control parameter for optimization and setting multiple focuses within a slot being scanned in the lithographic system so as to optimize the selected linewidth control parameter. The linewidth control parameter selected can include horizontal-vertical bias ("H-V bias"), group-to-isolated bias ("G-I bias"), and critical-dimension through-focus ("CD through-focus"). More than one such linewidth control parameter can be selected for optimization.

In order to set multiple focuses across a substrate, a flexible chuck is flexed, altering the focus at multiple points within the slot, thus optimizing the selected linewidth control parameter or paramters. The particular focus-settings are generating by calibrating a lithographic apparatus, a reticle, or a lithographic apparatus with reticle. Such calibrating can include the printing of a field through-focus or the use of an aerial image monitor to determine linewidths through-focus for a particular feature type within a slot. Separate calibrations can be done for different feature types (e.g., contacts and signal lines), or a single calibration can be performed.

In addition to setting multiple focuses at points within the slot, dynamically adjusting the focus at a particular slot location along the scan is also disclosed. A focus offset coefficient matrix is generated that can include multiple focus offset coefficients for points within a slot and at multiple slot locations along the scanning direction.

Also disclosed is a method of generating sets of focus offset coefficients for use in a lithographic system. The disclosed method includes a step of calibrating a lithography apparatus, a reticle, or a lithography apparatus with reticle. Such calibration produces data from which the sets of focus offset coefficients can be generated. These focus offset coefficients can include those corresponding to points within a slot and can additionally include focus offset coefficients for multiple slot points along a scanning direction. During calibration, linewidths are measured optically, with electrical probes, or with an aerial image monitor. Model data from sufficiently accurate models can also be used to generate focus offset coefficients.

The focus offset coefficients can be determined by plotting curves from the data gathered during calibration or by using a computation device or element to determine the sets of focus offset coefficients directly from the data.

Also disclosed is a system for selective linewidth optimization during a lithographic process. Such a system can include a projection system, a flexible chuck, and a focus offset controller connected to the projection system and the flexible chuck. The focus offset controller is configured to set multiple focuses within a slot being scanned during the lithographic process so as to optimize a linewidth control parameter. Such a system can also include a wafer stage upon which the flexible chuck is disposed and can be configured to set multiple focuses at a single slot point for different slot locations along a scanning direction.

BRIEF DESCRIPTION OF THE FIGURES

The accompanying drawings, which are incorporated herein and form part of the specification, illustrate the present invention and, together with the description, further serve to explain the principles of the invention and to enable a person skilled in the pertinent art to make and use the invention. Like reference numbers refer to like elements within the different figures.

DETAILED DESCRIPTION OF THE PREFERRED EMBODIMENTS

While the conventional approach discussed above is directed to improving average pattern sharpness, there are actually numerous specific pattern distortions that may affect the sharpness of a pattern printed during a lithographic process. These specific pattern distortions can be expressed through various linewidth control parameters. A number of these linewidth control parameters will be discussed. However, as would be apparent to a person skilled in the relevant art given this disclosure, the specific techniques disclosed herein would apply to the improvement of any particular linewidth control parameter and so this disclosure is not limited to the specific linewidth control parameters discussed below.

Linewidth control parameters can be used to characterize features other than lines. For example, contacts are subject to the same pattern distortions as are lines. Other features are also subject to these distortions, as would be apparent to a person skilled in the relevant art given this disclosure. Thus, while this disclosure is written in terms of lines and linewidths, these terms are meant to encompass any particular type of feature and dimension subject to pattern distortion during a lithographic process. Furthermore, while the instant invention is desribed in terms of optimizing linewidth control parameters through the use of focus offset coefficients, any type of systemic problem that can be compensated through the use of focus offsets is within the scope of this invention. For example, retical bi-refringence, dose control and illumination properties, and vibration are all systemic problems capable of compensation through the use of focus offset coefficients and so their compensation through the use of the method and system of the instant invention is within the scope of this disclosure.

Figure 1A:
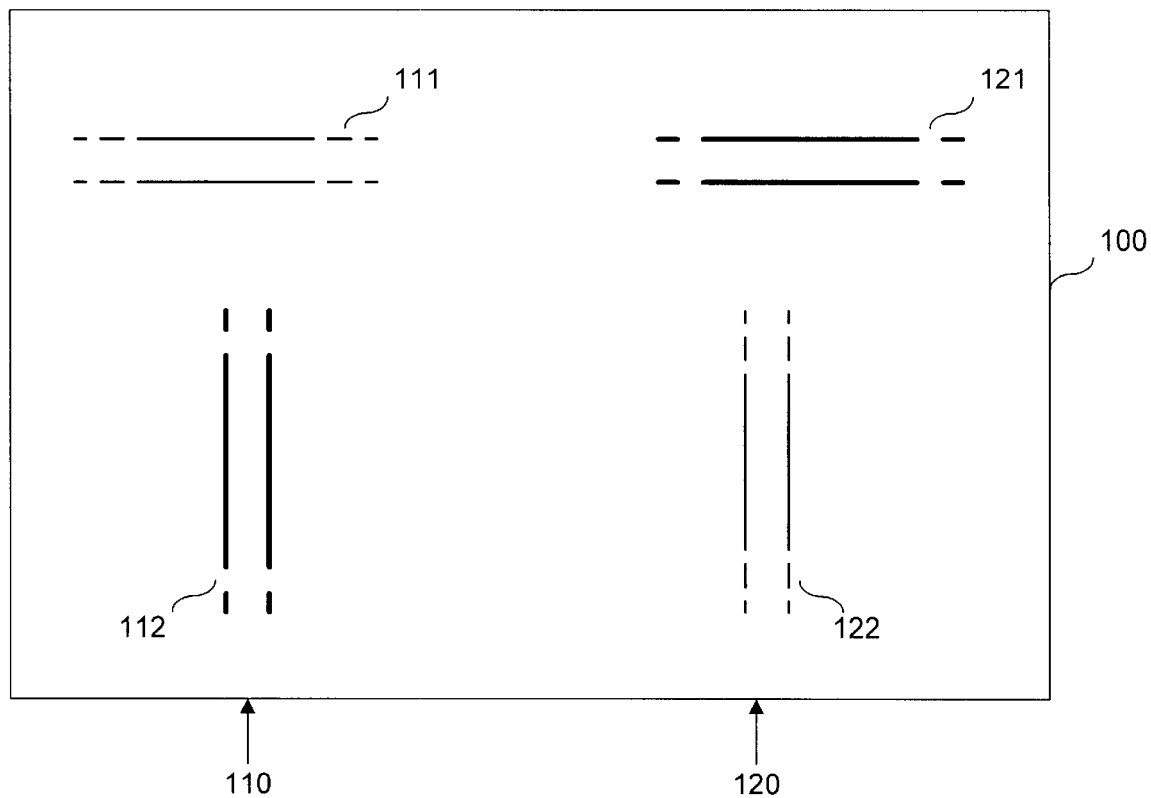
FIG. 1A illustrates a slot having lines exhibiting a different H-V bias at two points within the slot.

Horizontal-vertical bias ("H-V bias") refers to the linewidth control parameter characterized by a difference in linewidth between a horizontal line and a vertical line within a printed pattern where the horizontal and vertical lines would ideally have the same width. This type of pattern distortion is shown in FIG. 1A. FIG. 1A shows a slot 100 with horizontal and vertical lines 111, 112, respectively, at a first point 110 in the slot 100 and horizontal and vertical lines 121, 122, respectively, at a second point 120 in the slot 100. Only portions of a few lines are depicted in FIG. 1A. In an actual pattern, more lines would be present, as would be apparent to a person skilled in the relevant art. As can be seen in FIG. 1A, horizontal lines 111 are narrower than vertical lines 112 at the first slot point 110. Since these lines would ideally have the same width, an H-V bias exists between lines 111 and 112. This H-V bias can be determined by noting the difference in linewidth between the horizontal 111 and vertical lines 112. It should be noted that FIG. 1A is not drawn to scale and so the actual H-V bias depicted is for illustrative purposes only. A second H-V bias is shown at a second slot point 120 in FIG. 1. The H-V bias between horizontal lines 121 and vertical lines 122 at the second slot point 120 differs from the H-V bias at the first slot point 110. In fact, the H-V bias may differ continuously within the slot. Thus, while a difference in H-V bias is shown at two slot points 110, 120, such a difference may occur at many more points within the slot 100. Furthermore, while the difference in H-V bias depicted in FIG. 1A between the first and second slots 110, 120, involves a change between which type of lines (i.e. the horizontal or vertical lines) are wider, a difference in H-V bias can also occur as a result of a marginal widening or narrowing of one type of line (i.e. horizontal or vertical) between any two points in the slot 100.

Figure 1B:
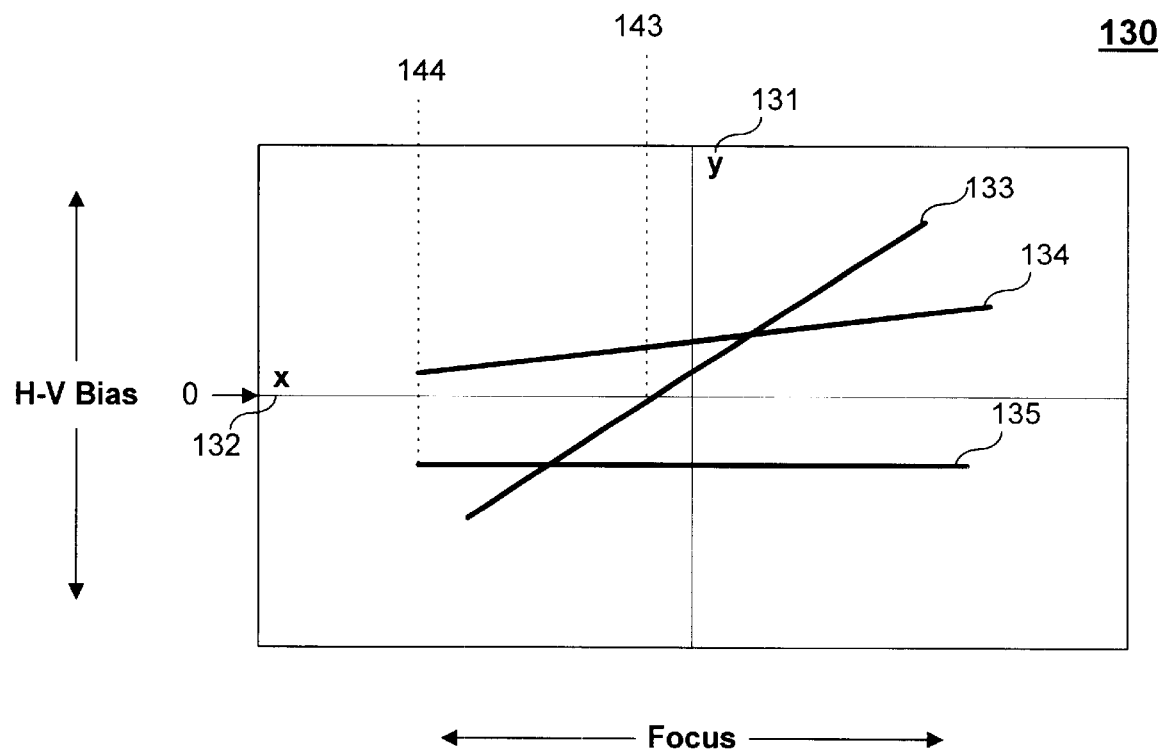
FIG.1B is a plot of H-V bias verses focus, illustrating different exemplary relationships of H-V bias to focus.

As discussed above in connection with FIG. 1A, H-V bias can differ at various points within a slot. The relationship between H-V bias and focus setting can also differ. FIG. 1B illustrates three exemplary relationships between H-V bias (shown along the y-axis 131) and focus setting (shown along the x-axis 132). While FIG. 1B illustrates these plots as lines, such plots could be non-linear and thus represented by a polynomial. In a first example 133, H-V bias changes significantly with changes in focus setting. The plots shown in FIG. 1B can be derived, for example, from a Bossung curve like that shown in FIG. 4, discussed below. At a particular focus setting 143, H-V bias can be reduced to zero in the first example 133. In a second example 134, H-V bias changes with focus setting, but to a lessor degree than with the first example 133. Unlike the first example 133, the H-V bias of the second example 134 cannot be eliminated but can only be minimized at a particular focus setting 144. Finally, in the third example 135, H-V bias is independent of focus settings. Unlike the first and second examples 133, 134, there is no particular focus setting that minimizes or eliminates the H-V bias of the third example 135. Thus, as can be seen from the foregoing discussion, the focus setting that minimizes H-V bias can vary at each point within a slot being scanned. Likewise, the degree of dependency of H-V bias on focus setting also varies at different points withing the slot. This variation is a characteristic of the particular lithography apparatus as well as the particular reticle being used. Variation causes by the particular reticle being used can be a result of the features on the reticle, the reticle type, or any other characteristic of the reticle that results in linewidth variation. Thus, the term reticle, as used herein, is meant to refer to both the features on and the physical reticle itself.

Figure 2:
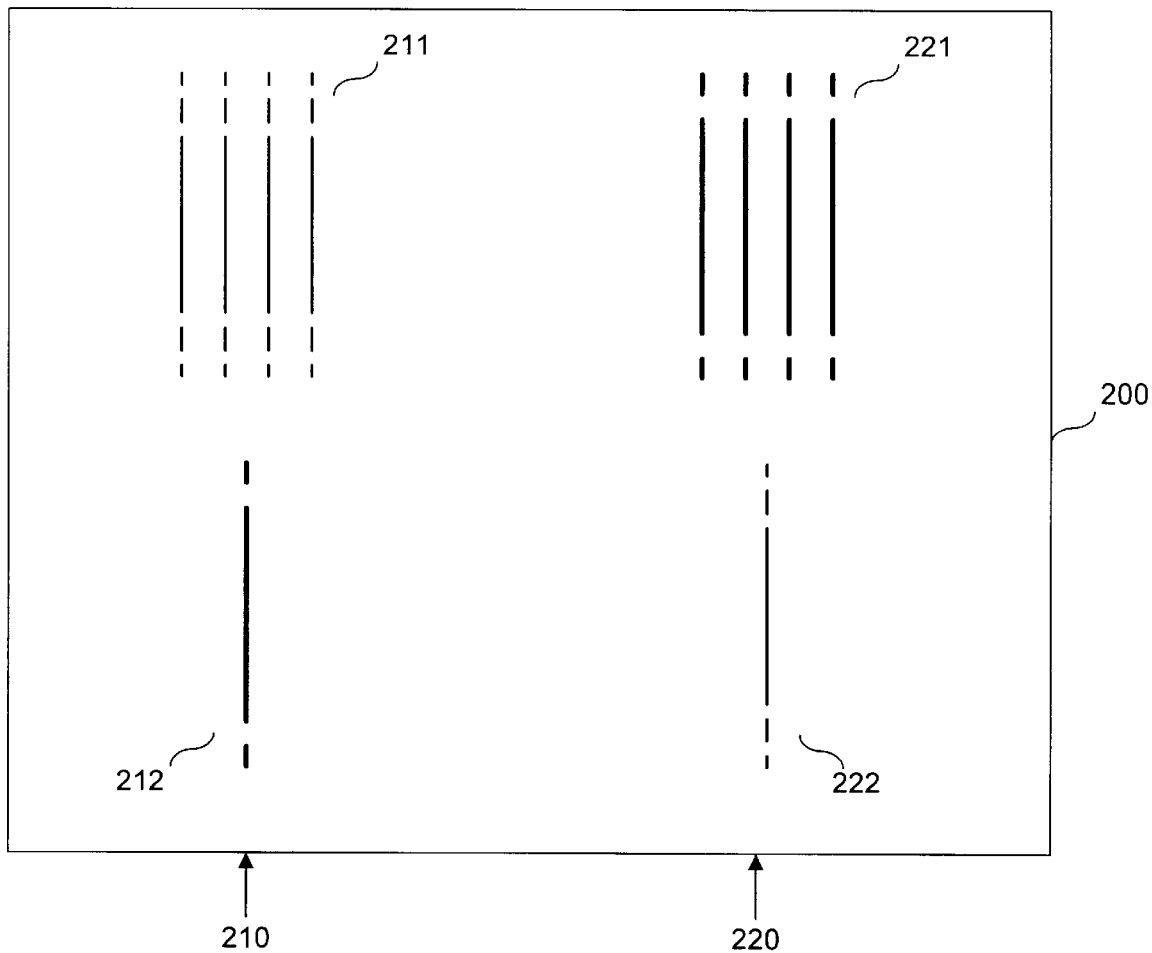
FIG. 2 illustrates a slot having lines exhibiting a different G-I bias at two points.

Group to isolated bias ("G-I bias") refers to the linewidth control parameter characterized by a difference in linewidth between lines within a group and isolated lines within the same pattern where all the lines would ideally have the same width. FIG. 2 illustrates an example of G-I bias. FIG. 2 shows a slot 200 with two sets of group lines 211, 221 and two isolated lines 212 and 222. As with FIG. 1, only portions of a few lines are depicted in FIG. 2. In an actual pattern, more lines would be present, as would be apparent to a person skilled in the relevant art. Furthermore, it should be noted that the difference between group lines and what is considered an isolated line is a function of line pitch and/or line width. Line pitch is the distance between neighboring lines. As line pitch increases, a particular line takes on the characteristics of an isolated rather than group line. The classification of lines as isolated or group for the purposes of determining G-I bias within a particular pattern would be apparent to a person skilled in the relevant art given this disclosure.

At a first position 210 within the slot 200 of FIG. 2, the isolated line 212 is wider than the group lines 211. In a pattern where the group and isolated lines ideally have the same width, this printed width difference is a G-I bias. At a second point 220 within the slot 200 of FIG. 2, group lines 221 are depicted as being wider than isolated line 222. This is a second instance of G-I bias. In fact, the G-I bias may differ continuously within the slot. Thus, while a difference in G-I bias is shown at two slot points 210, 220, such a difference may occur at more points within the slot 200. Furthermore, while the difference in G-I bias depicted in FIG. 2 between the first and second slot points 210, 220, involves a change between which type of lines (i.e. group or isolated) are wider, a difference in G-I bias can also occur as a result of a marginal widening or narrowing of one type of line (i.e. group or isolated) between any two points in the slot 200. As can be seen from the foregoing discussion, the focus setting that minimizes G-I bias can vary at each point within a slot being scanned. Likewise the dependency of G-I bias on the focus setting also varies within the slot. As discussed above in connection with H-V bias, this variation is a characteristic of the particular lithography apparatus as well as the particular reticle being used.

Figure 3A:
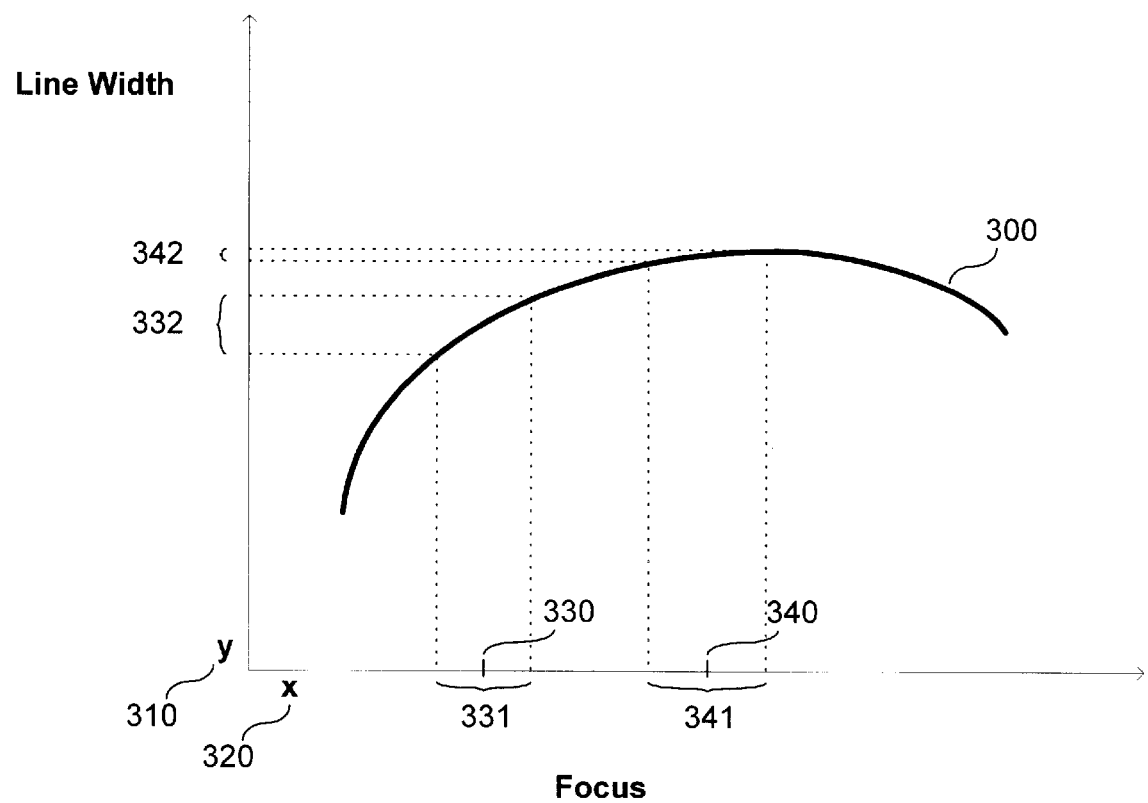
FIGS. 3A and 3B are Bossung curve plots illustrating different CD through-focus ranges.

Critical dimension uniformity ("CD uniformity") refers to the minimization of variation of a single critical dimension at different points within the pattern. In other words, as the difference in actual dimension of features having the same critical dimension decreases within the pattern, CD uniformity increases. CD uniformity is tied to critical dimension through-focus ("CD through-focus"). At any particular focus setting, the printed width of a given line will vary if the actual focus where the line is printed differs from the focus setting. This difference between actual and focus setting can be intentional, or can be an unintentional effect of the particular equipment being used. The variation in printed width is shown in FIG. 3A, which illustrates a Bossung curve 300 for a line printed at a particular point within a slot. The Bossung curve 300 is a through-focus plot of a line where the y-axis 310 indicates the width of the printed line verses the focus setting corresponding to the x-axis 320. As shown in FIG. 3A, a first range of focus 331 corresponds to a first focus setting, 330. For this range of focus, the linewidth variation corresponds to a first linewidth range, 332. Meanwhile, a second range of focus 341 corresponds to a second focus setting, 340. For this second range of focus, the linewidth variation corresponds to a second linewidth range, 342. Each of these ranges 332, 342 can be referred to as the total indicated range of a critical dimension (CD TIR). Since the size of the first and second ranges of focus 331, 341 are the same, it is apparent from the Bossung curve 300 that the CD TIR at the second focus setting 340 is less than the CD TIR at the first focus setting, 330.

Figure 3B:
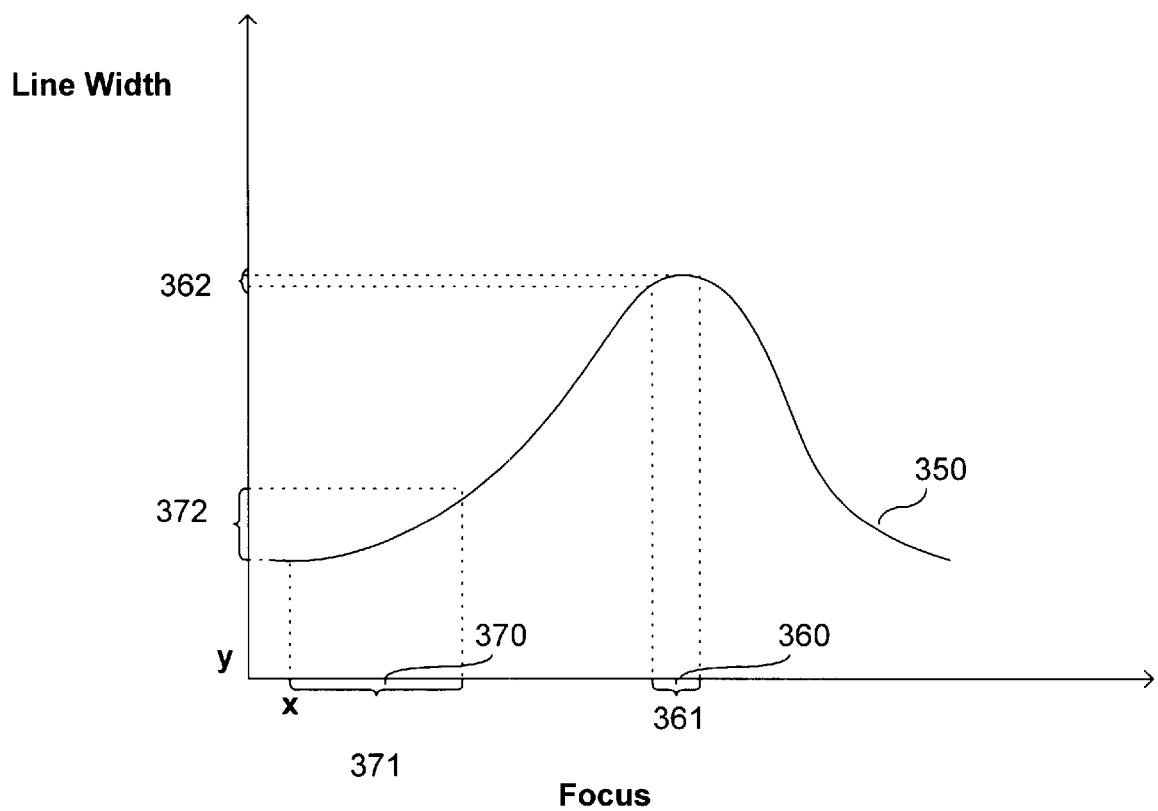

Bossung curve 300 can be used to determine the best focus for a known focus range. For example, a particular lithographic apparatus might exhibit a known focus range, or depth of focus, for a given focus setting. The Bossung curve can then be used to determine where on that curve the given focus range results in a minimum CD TIR. The center point of this range on the Bossung curve is the best focus for this known focus range. Depending on the particular curve, it is possible that the best focus setting will differ depending on the size of the known focus range. Such a situation is shown, for example, in FIG. 3B, which illustrates a second Bossung curve 350. Bossung curve 350 can be used to determine a best focus, i.e., a focus that has a minimum CD TIR for a given focus range, for each of two ranges 361, 371. As shown FIG. 3B, the second range 371 is about twice as big as the first range 361. At a first focus setting 360, the CD TIR 362 corresponding the first focus range 361 is minimized. However, if the first range 361 were the size of the second range 371, it is apparent from the Bossung curve 350 that the CD TIR would be significantly larger at the first focus setting 360 due to the sharp declines in the curve in areas surrounding the first focus setting. Thus, the best focus setting for the second focus range 371 is at a second focus setting 370. This second focus setting 370 results in a CD TIR 372 that is smaller than it would be if the second focus range 371 were at the first focus setting 360.

Figure 4A:
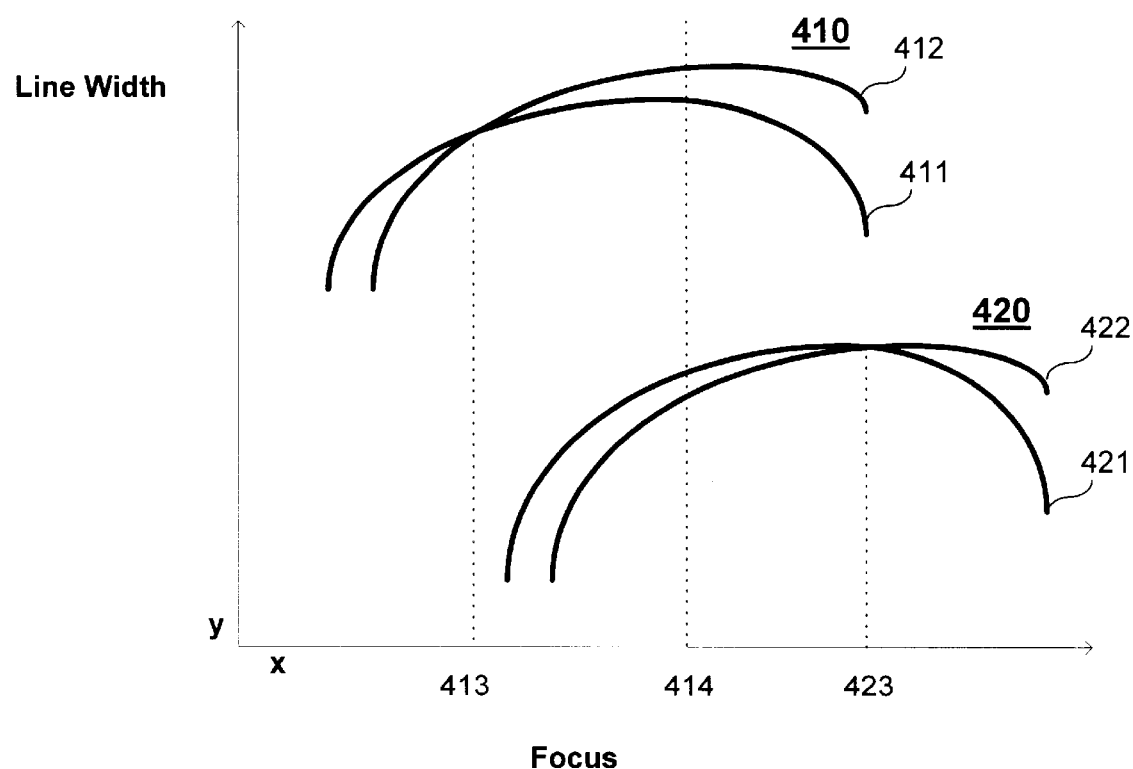
FIG. 4A is a combination Bossung/H-V bias plot showing two different H-V bias CD through-focus situations for two corresponding points within a slot.
Figure 4B:
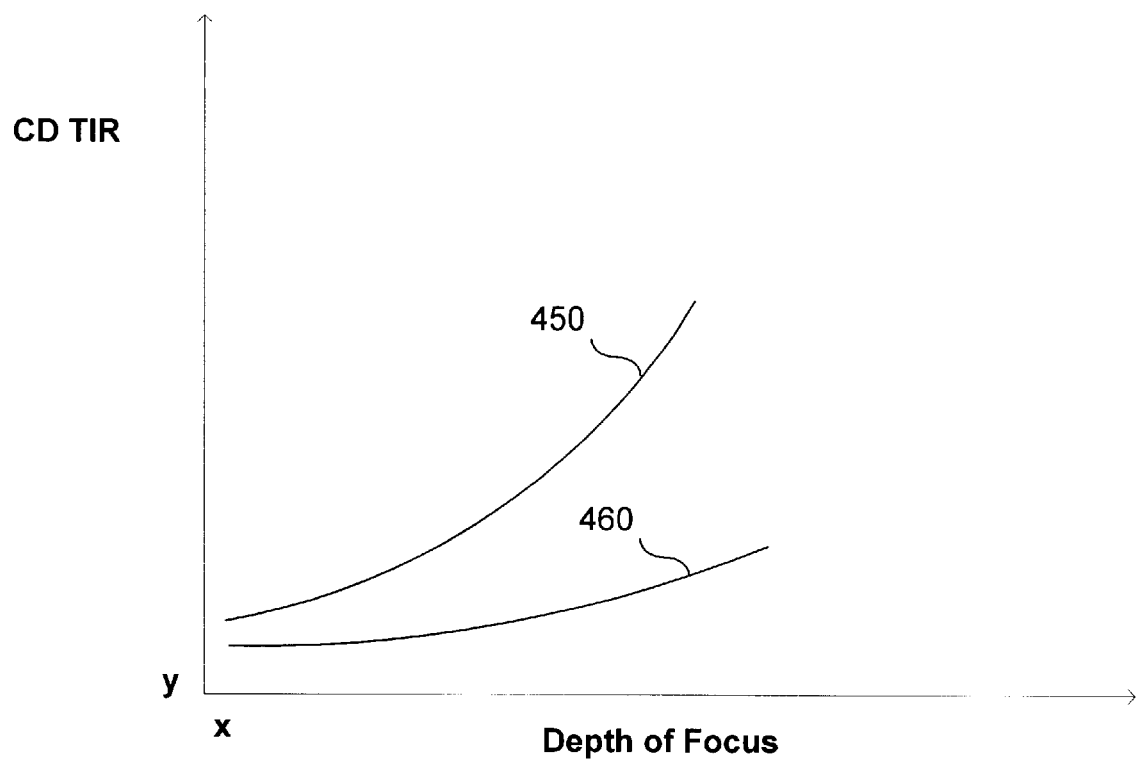
FIG. 4B is a plot of critical dimension total indicated range verses total depth of focus for two different focus setting situations.

While the specific linewidth control parameters discussed above have each been looked at separate from the others, it is helpful to consider the combined effects of pattern distortions to understand the present invention. FIG. 4A is a Bossung curve plot for two particular points within a slot. A first pair of curves 410 corresponds to a first point within a slot, while a second set of curves 420 corresponds to a second point within the slot. In the first set of curves 410, the linewidth of a first horizontal patterned line 411 is shown together with the linewidth of a first vertical patterned line 412. In the second set of curves 420, the linewidth of a second horizontal patterned line 421 is shown together with the linewidth of a second vertical patterned line 422. As can be seen from the first set of curves 410, the H-V bias is minimized at focus setting 413, where the two curves cross. At focus setting 413, the linewidth of the horizontal line 411 is equal to the linewidth of the vertical line 412. However, with the first set of curves 410, CD TIR is minimized at a focus setting different from that where H-V bias is minimized. At focus setting 414, CD through-focus TIR is minimized since at this focus setting the linewidth stays relatively constant in a range of focus around the focus setting. In the second set of curves 420, however, H-V bias is minimized at the same focus setting as is CD through-focus. As can be seen from these two sets of curves, while different linewidth control parameters can sometimes be optimized together, as with the second set of curves 420, many times the optimization of one linewidth control parameter leads to greater error in another linewidth control parameter, as with first set of curves, 410. It is also apparent from FIG. 4A that the optimal focus at a first point in a slot may differ from the optimal focus at a second point within the same slot, even when one is trying to optimize the same linewidth control parameters. FIG. 4B illustrates the advantages of increasing the number of focus settings within a slot.

FIG. 4B is a plot of CD TIR, along the y-axis, verses total depth of focus, along the x-axis, for two different focus setting situations. A first curve 450 illustrates the relationship between CD TIR and depth of focus when a single focus setting is used for the entire slot. Since only one focus setting is used, CD TIR increases significantly with increases in depth of focus. This is because features printed at different points within the slot will have different associated Bossung curves, and thus different optimal focus settings for minimizing CD TIR.

Referring back to FIG. 4A, focus setting 414 results in a minimum CD TIR at a first slot point, while focus setting 423 results in a minimum CD TIR at a second slot point. If the slot were printed using only a single focus setting, the average of the first and second focus settings might be used. This average of the two focus settings would result in greater CD TIR for a particular depth of focus during the scan than would the use of the two separate focus settings for the two slot points.

Thus, a second curve 460 illustrates the relationship between CD TIR and depth of focus when multiple focus settings are used in accordance with the instant invention during the printing of the slot. Since, multiple focus settings are used, the magnitude of the CD TIR for a particular depth of focus is less than if an average focus setting is used. The particular focus settings used at each slot point can be determined from FIG. 4A. From FIG. 4A, it is also apparent that the particular focus settings used to minimize CD TIR may differ from those used to minimize H-V bias. Thus, during manufacture, a tradeoff can be made as to which linewidth control parameter is most important to a particular structure.

The linewidth control parameters discussed above can have different degrees of importance depending on the particular device being fabricated. For example, in a dense circuit where timing is critical, H-V bias may need to be minimized while G-I bias can be ignored. On the other hand, in a structure where many parallel lines are disposed as an upper device layer, H-V bias may be unimportant while CD through-focus uniformity may be important due to non-planar topography considerations. In addition to these examples, there are many different situations where optimization of one particular linewidth control parameter is preferred, as would be apparent to a person skilled in the relevant art given this disclosure. As such, solutions directed to average image sharpness are less desirable than solutions directed to the selective optimization of particular desired linewidth control parameters. The present invention provides such solutions for selective optimization.

The linewidth control parameters of any given line or feature within a printed pattern vary as a result of optical capabilities of the lithography apparatus used, particular characteristics of the reticle, focus setting, light dose fluctuations, and the like, as would become apparent to a person skilled in the relevant art given this disclosure. The instant invention uses focus offset coefficients to control focus within a slot to compensate for the linewidth control parameter variations introduced by the factors contributing to such variations. A set, or sets, of focus offset coefficients is generated for a particular lithography apparatus, depending on the number of linewidth control parameters for which correction is desired. For example, the present invention can include a single set of focus offset coefficients if only one linewidth control parameter is of concern, e.g. G-I bias. Alternatively, multiple sets can be generated when multiple linewidth control parameters are of concern, e.g. G-I bias and H-V bias. Such focus offset coefficients can be generated for a particular lithography apparatus, for a particular reticle, or for a particular combination of reticle and lithography apparatus. Once generated, focus offset coefficients can be used until such time as apparatus or reticle calibration indicates new focus offset coefficients should be generated.

The first step in generating focus offset coefficients is an initial calibration. While the initial calibration will be discussed in terms of a lithography apparatus, such a calibration can also be performed for a particular reticle, or for a particular combination of reticle and apparatus. During initial calibration, a through-focus "snapshot" is made of a given apparatus, reticle, etc. Fields are printed with the same exposure through-focus. Once fields are printed through-focus, linewidths are determined and Bossung curves, H-V bias curves, G-I bias curves, etc. are plotted for each desired point in the slot. Linewidths of a printed field can be measured in any effective way as would be apparent to one skilled in the relevant art, for example optically, through the use of electrical probes, or with an aerial image monitor.

Figure 5:
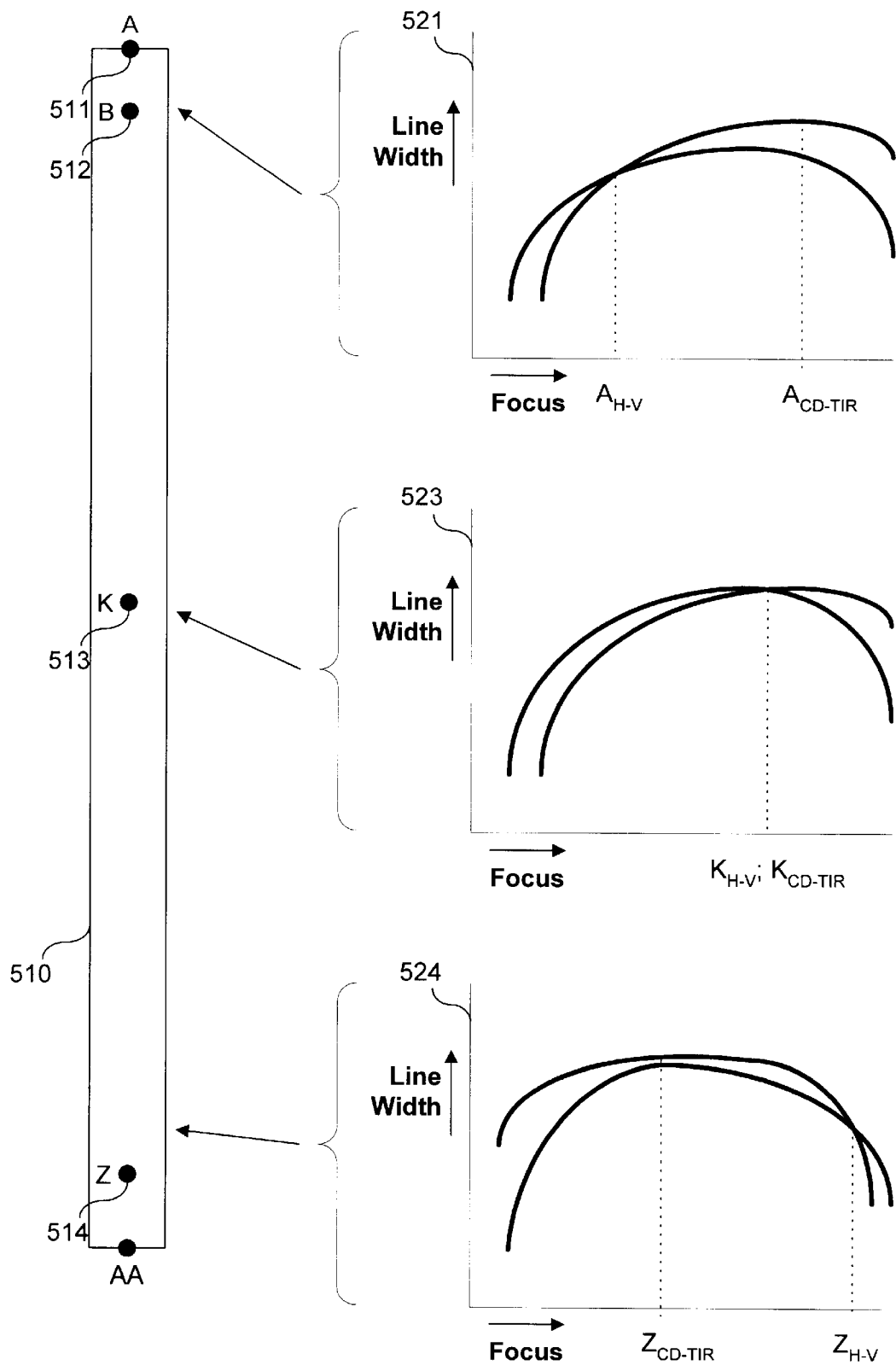
FIG. 5 illustrates a slot with several points and their corresponding Bossung/H-V bias curves.

The particular number of points selected is a factor of desired precision. For example, a typical slot can measure 26×5 millimeters. With such a slot, a point at each end, and one every millimeter, or 27 points, could be plotted. As one skilled in the relevant art would understand given this disclosure, the number of points selected is not critical but can be varied depending on desired precision and apparatus capabilities. For example, by selecting additional points, greater precision can be obtained, but performing the scan across the slot with the necessary number of focus offsets will requires a greater degree of focus control, which will be discussed more fully below. On the other hand, by selecting fewer points, a lessor degree of precision will be obtained, but the necessary focus control will be much less. The instant inventors have found that approximately 27 points for a 26×5 mm slot is an effective tradeoff between precision and focus control. FIG. 5 illustrates a slot 510 with several points 511–514 shown within the slot with representative Bossung/H-V bias curves 521, 523, 524 of three of the points 511, 513, 514. The first Bossung/H-V bias curve 521 corresponds to point A and indicates that at point A, H-V bias is minimized at focus $A_{H-V}$, while CD through-focus is minimized at focus $A_{CD-TIR}$. Bossung/H-V bias curve 523 corresponds to point K and indicates that at point K, H-V bias and CD through-focus are both minimized at the same focus, $K_{H-V}$ and $K_{CD-TIR}$. Finally, Bossung/H-V bias curve 524 corresponds to point Z and indicates that at point Z, H-V bias is minimized at focus setting $Z_{H-V}$ and CD through-focus is minimized at focus setting $Z_{CD-TIR}$. From these Bossung/H-V bias curves (one for each desired point in the slot), sets of focus offset coefficients can be generated by comparing the desired focus setting at each point to a predetermined nominal focus setting. From the particular Bossung/H-V bias curves of FIG. 5, H-V bias focus offset coefficients and CD through-focus offset coefficients can be generated. The Bossung curves themselves can be generated, for example, through the use of commercially available modeling programs such as PROLITH from Finle Technologies, or other similar programs known to those skilled in the relevant art. In addition to the particular linewidth control parameters shown in FIG. 5, other linewidth control parameters can be plotted from the calibration through-focus field, such as G-I bias, or any other linewidth control parameter as would be apparent to a person skilled in the relevant art given this disclosure.

The calibration technique discussed above can be used for a particular lithography apparatus, reticle, or combination of reticle and lithography apparatus in order to achieve desired sets of focus offset coefficients. Likewise, the calibration technique discussed can be repeated as required to maintain accurate sets of focus offset coefficients for a particular reticle or apparatus. The frequency of such calibration (i.e., how often calibration needs to be performed for a given system) would be apparent to one skilled in the relevant art given this disclosure.

In addition to a calibration technique using through-focus fields, as discussed above, other types of calibration techniques could be used without departing from the instant invention, as would be apparent to one skilled in the relevant art given this disclosure. For example, rather than printing fields through-focus, an aerial image monitor could be used to determine to measure linewidths at various slot points and focus settings.

Once the desired focus offset coefficients have been generated, they must be used during device fabrication in order to optimize a desired linewidth control parameters. As discussed above, the selection of the desired linewidth control parameter to be optimized, and thus the selection of a desired set of focus offset coefficients, is dependent on the particular device being fabricated and can change from device to device. The selection of a particular set of focus offset coefficients from among a plurality of such sets would be apparent to a person skilled in the relevant art given this disclosure. During fabrication, a different focus is set at each point within the slot as dictated by the selected set of focus offset coefficients. Setting different focuses within the slot can be done through the use of a flexible, or deformable, chuck. A flexible chuck is able to alter the wafer elevation at various points thus allowing various focus settings to be set. Preferably, different focus settings are set with the flexible chuck disclosed in co-pending U.S. patent application Ser. No. 09/575,998, incorporated herein by reference in its entirety. By setting multiple best focuses at desired points within the slot in accordance with the present invention, slot illumination compensation can be minimized.

Figure 6:
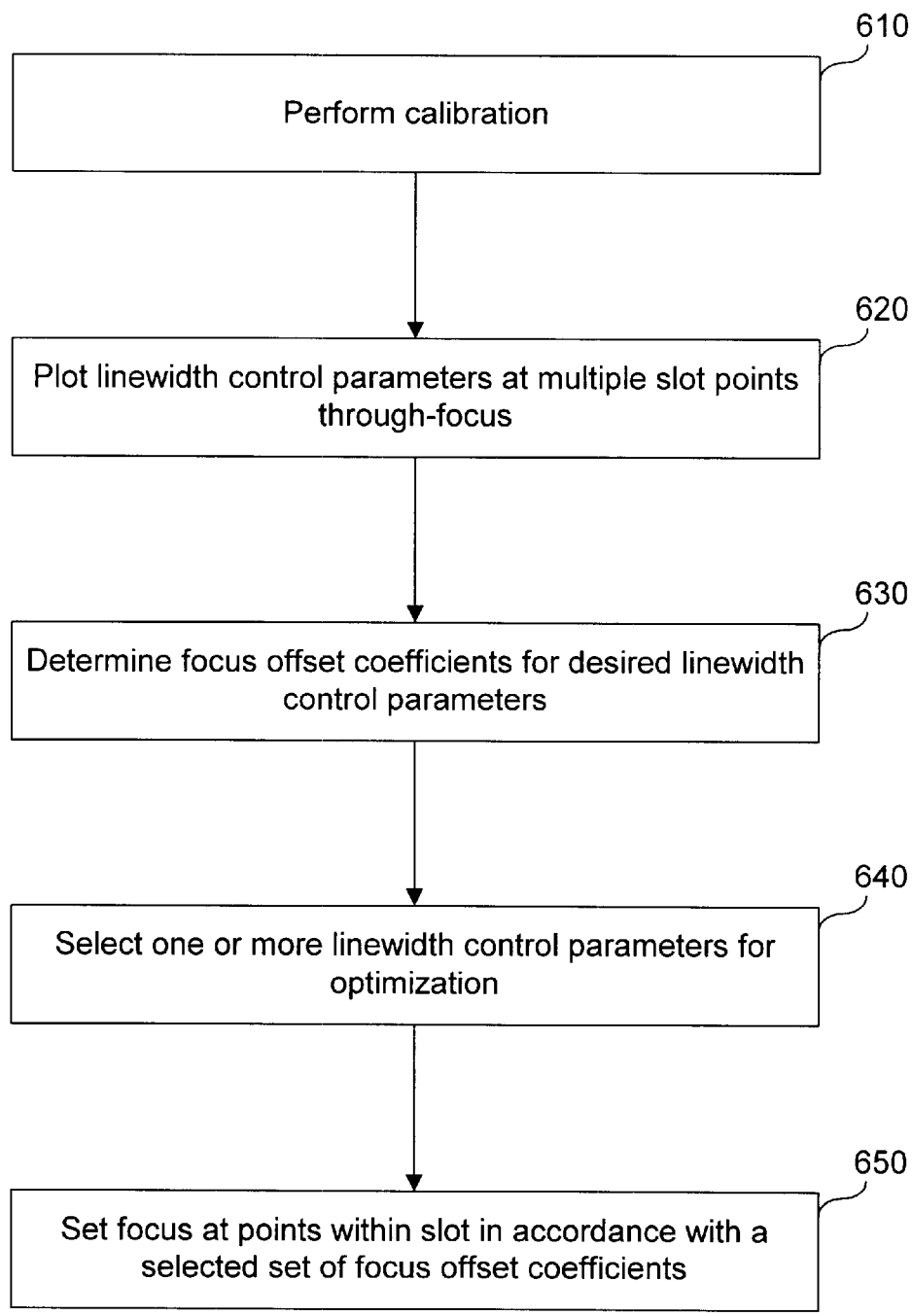
FIG. 6 is a process flow diagram illustrating the steps of generating focus offset coefficients and selective linewidth optimization using such coefficients.

The steps discussed above are illustrated in FIG. 6, which shows the steps in a method of selective linewidth optimization in accordance with the present invention. In a first step 610, calibration is performed. As discussed above, this calibration can be through the through-focus printing of fields or through the use of an aerial image monitor. Other calibration techniques could be used without departing from the instant invention, as would be apparent to a person skilled in the relevant art given this disclosure. The calibration of step 610 can be performed for a lithography apparatus, a reticle, a combination of reticle and apparatus, or any other element capable of calibration that contributes to linewidth variation, as would be apparent to a person skilled in the relevant art given this disclosure. In a next step 620, linewidth control parameters are plotted through-focus at various points within the slot. Such plots can include Bossung curves, H-V bias curves, G-I bias curves, etc. and such linewidth control parameters can include CD through-focus, H-V bias, G-I bias, etc. Other linewidth control parameters can be plotted without departing from the instant invention as would be apparent to a person skilled in the relevant art given this disclosure. In a next step 630, focus offset coefficients for desired linewidth control parameters are determined. The focus offset coefficients are determined from the plots of the linewidth control parameters, at discussed above. Alternatively, the focus offset coefficients can be determined without actually making the described plots. For example, if an aerial image monitor is used to measure linewidths, it can also be programmed to calculate sets of focus offset coefficients. Likewise, other computation devices or elements could be used to determine focus offset coefficients from calibration data including linewidths and focus settings at points within the slot, without actually plotting the linewidth control parameters. Such computation devices and elements, as well as any necessary programming, would be apparent to a person skilled in the relevant art given this disclosure. In a next step 640, one or more linewidth control parameters are selected for optimization, depending on particular design requirements, which would be apparent to those skilled in the relevant art at the time of design implementation. If more than one linewidth control parameter is selected for optimization in step 640, a tradeoff analysis is done to determine the best focus setting from the focus offset coefficients corresponding to the selected linewidth control parameter. Such an analysis would be apparent to one skilled in the relevant art given this disclosure. If only one linewidth control parameter is of concern, then the step of selecting a linewidth control parameter for optimization can be skipped. Finally, in a step 650, different focus settings are set at points within a slot in accordance with a selected set of focus compensation coefficients. These focus settings can be set through the use of a flexible chuck, as discussed above.

Figure 7A:
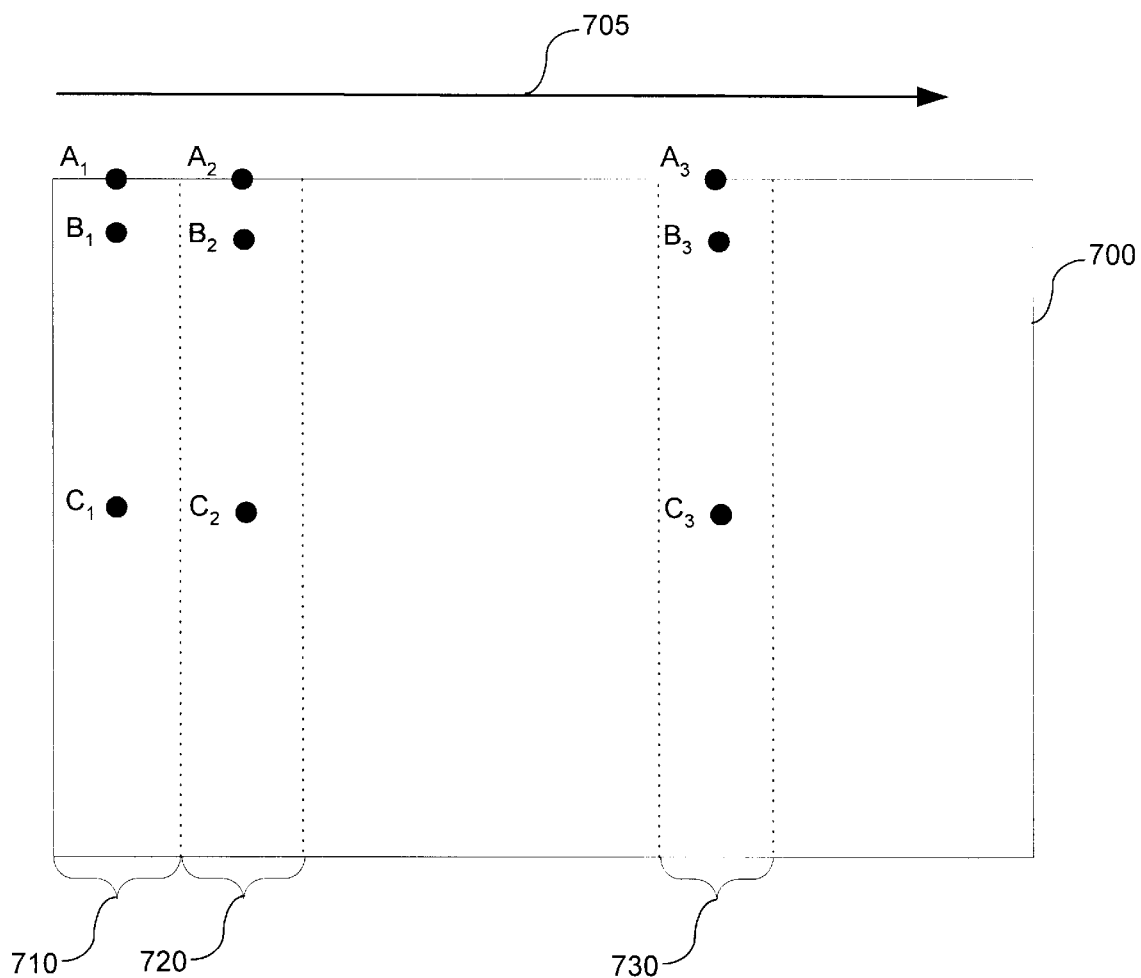
FIG. 7A shows several slot locations along a scan within a field.

In addition to process discussed above, linewidth control parameters can be optimized along the scan in addition to at points within the slot. Returning to FIG. 5, it is possible that the optimal focus at point K 513 in the slot 510 varies during the scan. FIG. 7A illustrates such a situation. FIG. 7A illustrates a field 700 printed during a step-and-scan process. A slot is printed along a scan direction 705 resulting in the printed field 700. While the slot is printed across the field 700 during a scan, FIG. 7A illustrates three distinct slot locations 710, 720, 730 along the field 700. These slot locations represent snapshots in time during the scan. At the first slot location 710, three points are depicted: $A_1$, $B_1$, and $C_1$. These three points represent different slot locations at which optimal focus setting can be set according to the instant invention. At the second slot location 720, three more points are depicted $A_2$, $B_2$, and $C_2$. Finally, at a third slot location 730, three more points are depicted $A_3$, $B_3$, and $C_3$. Thus, nine different points are illustrated. Each of these points may have an associated ideal focus setting for any particular linewidth control parameter. This can be determined by printing a pattern with a known focus setting for a point within the slot. The resulting printed pattern can then be analyzed to determine any feature variation at a given point along the scan, for example at points $A_1$, $A_2$, and $A_3$. In order to compensate for such variation, the focus settings can be dynamically adjusted during the scan. Thus, rather than determining the ideal focus settings at 27 points within a slot, a matrix of focus settings can be generated, with each point in the slot having multiple focus setting along the scan. The actual number of focus settings within the matrix can be determined based on the desired precision of the system, the actual number of settings being dependent on considerations apparent to those skilled in the art, given this disclosure. In order to print a field 700 with the focus settings $A_1$–$C_3$ contained the matrix, the focus settings at points in the slot are dynamically adjusted during scan as the slot moves along the field 700.

Figure 7B:
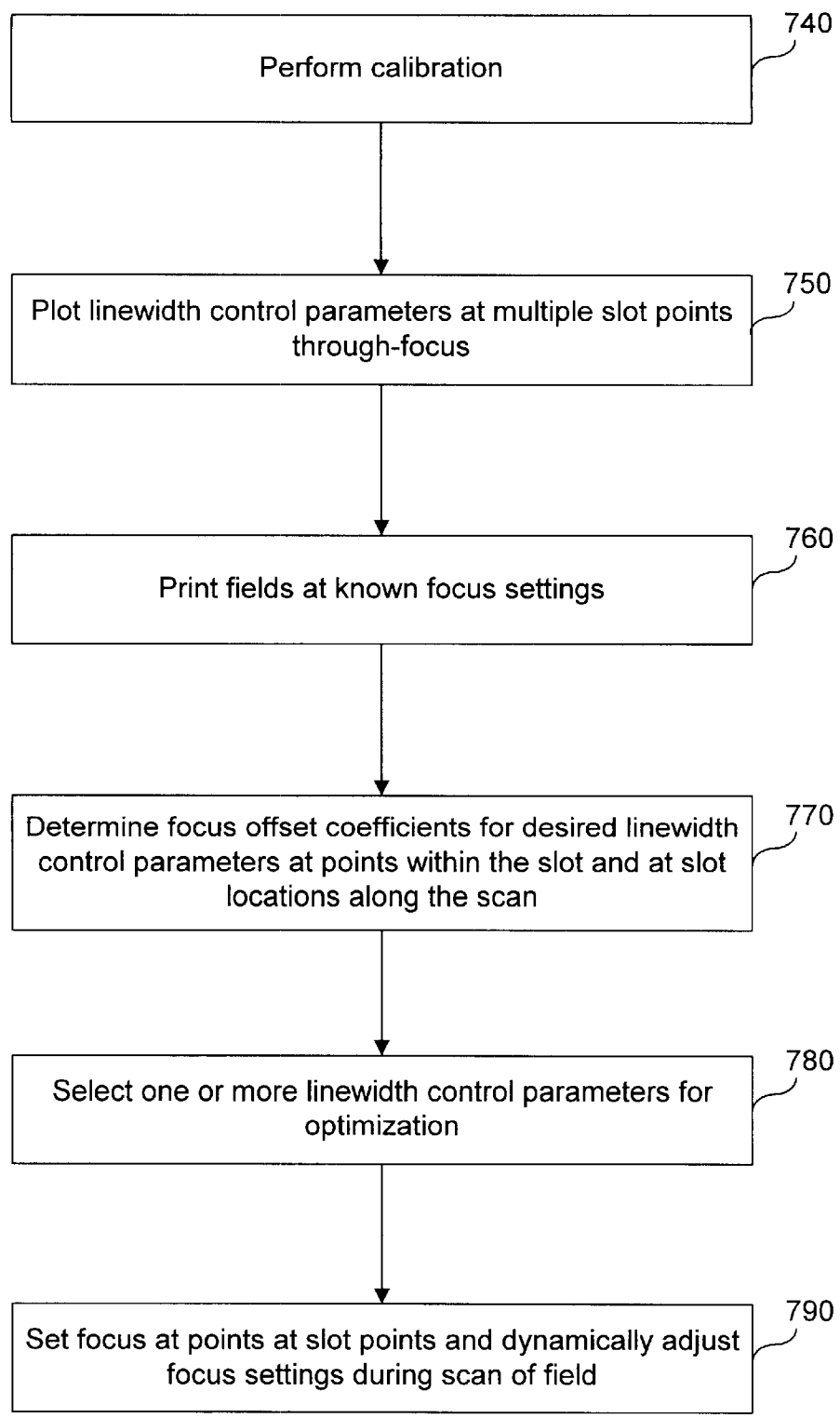
FIG. 7B is a process flow diagram illustrating the step of generating focus offset coefficients for points within the slot at slot locations along the scan.

FIG. 7B shows the steps in a method of selective linewidth control parameters where focus is varied dynamically during the scan. In a first step 740, calibration is performed. As discussed above, this calibration can be through the through-focus printing of fields, or through the use of an aerial image monitor, for example. Other calibration techniques could be used without departing from the instant invention, as would be apparent to a person skilled in the relevant art given this disclosure. The calibration step 740 can be performed for lithography apparatus, a reticle a combination of reticle and apparatus, or any other element capable of calibration that contributes to linewidth variation, as would be apparent to a person skilled in the relevant art given this disclosure.

In a next step 750, linewidth control parameters are plotted through-focus at various points within the slot. Such plots can include Bossung curves, H-V bias curves, G-I bias curves, and the like. Other linewidth control parameters can be plotted without departing from the instant invention as would be apparent to a person skilled in the relevant art given this disclosure.

In a next step 760, fields are printed at known focus settings. Focus offset coefficients for desired linewidth control parameters at points within the slot and at slot points along the scan are then determined, as illustrated at a next step 770. These focus offset coefficients can be determined from the plots of the linewidth control parameters as well as from printed fields generated in step 760. The printed fields can be analyzed to determine linewidth control parameter variation at a particular slot point along the scan for a given focus setting. The various focus offset coefficients determined in step 770 form a matrix of focus offset coefficients for a particular linewidth control parameter.

In a next step 780, one or more linewidth control parameters is selected for optimization. Thus, the particular focus offset coefficient matrix used in subsequent steps is based on the linewidth control parameter selected for optimization. If more than one linewidth control parameter is selected for optimization in step 780, a tradeoff analysis is done to determine the best focus setting from the focus offset coefficients corresponding to the selected linewidth control parameter. Such an analysis would be apparent to one skilled in the relevant art given this disclosure. If only one linewidth control parameter is of concern, then the step of selecting a linewidth control parameter for optimization can be skipped. In a final step 790, focus settings are set and dynamically adjusted during the scan of a field in accordance with the matrix of focus offset coefficients.

Figure 8:
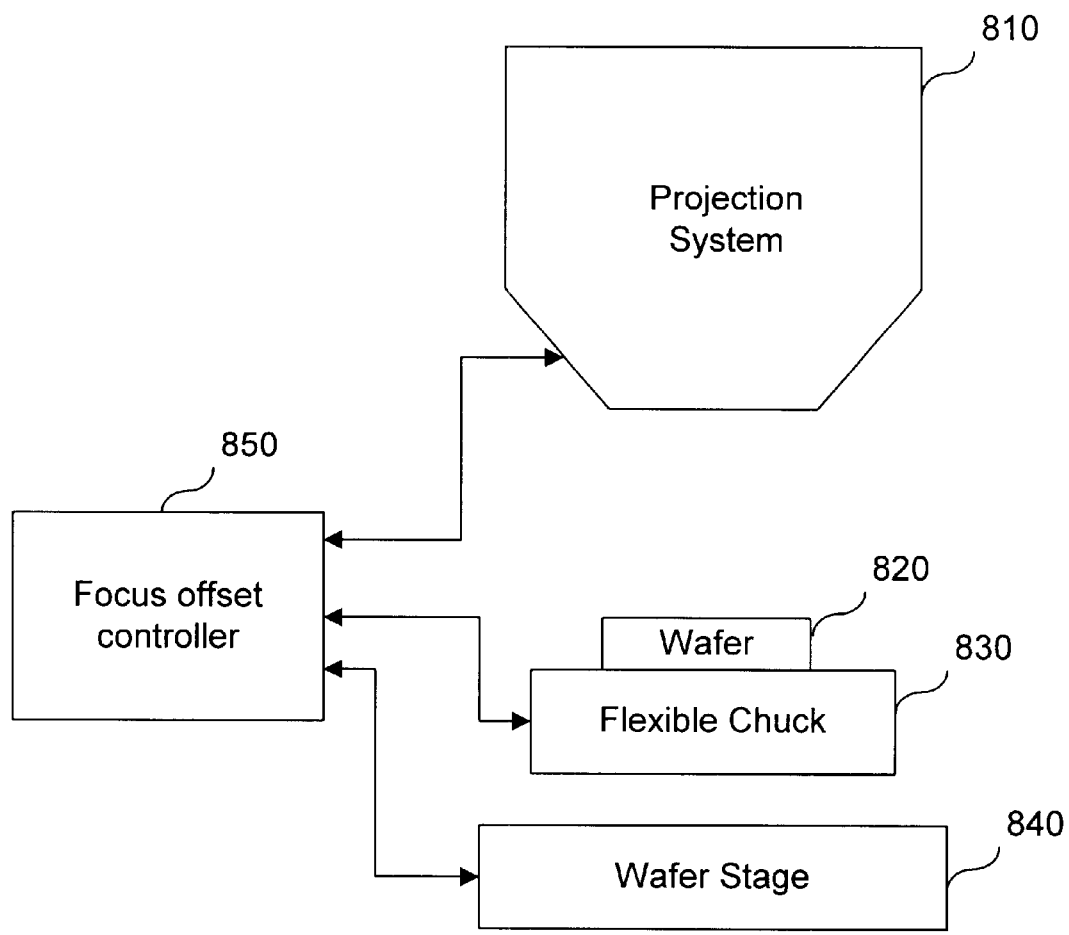
FIG. 8 is a block diagram illustrating an exemplary implementation of a system in accordance with the instant invention.

FIG. 8 is a block diagram illustrating an exemplary system 800 in accordance with the instant invention. A projection system 810 is provided that includes elements for projecting a pattern onto a wafer 820 during a lithographic process. For example, projection system 810 can include projection optics, a reticle, and additional elements as would be present in a step-and-scan system. The particular elements included in the projection system 810 would be apparent to a person skilled in the relevant art given this disclosure. The wafer 820 can be a semiconductor wafer, or any other type of substrate that can be lithographically patterned. Flexible chuck 830 is capable of producing elevation changes at an upper surface so as to change the elevation of various points of the surface of the wafer 820 disposed on the flexible chuck 830. The flexible chuck 830 can be of the type disclosed in co-pending U.S. application Ser. No. 09/575,998 discussed above. Alternatively, the flexible chuck 830 can be another type of flexible chuck, as would be apparent to a person skilled in the relevant art given this disclosure. The flexible chuck is mounted atop a wafer stage 840. The wafer stage 840 serves to move the flexible chuck 830 and wafer 820 relative to the projection system 810. Finally, the projection system 810, flexible chuck 830, and wafer stage 840 are connected to a focus offset controller 850. The focus offset controller 850 communicates with the other system elements in order to set the appropriate focus offsets at the appropriate wafer locations, and at the appropriate time. This offset controller 850 can be a programmed general purpose computer, or can be a function or functional element of another system element. The offset controller 850 uses feedback information from the wafer stage 840 and flexible chuck 830 to monitor the location of the wafer being scanned, and sends the appropriate signals to the flexible chuck to implement a focus offset. This is done in conjunction with information provided from, and to, the projection system 810. The particular focus offsets used may be preprogrammed into the focus offset controller 850, or these focus offsets may be calculated by the focus offset controller itself. During operation, the focus offset controller 850 can set multiple focuses within a slot being scanned so as to optimize a linewidth control parameter. The particular programming and implementation of the focus offset controller would be apparent to a person skilled in the relevant art given this disclosure.

CONCLUSION

While various embodiments of the present invention have been described above, it should be understood that they have been presented by way of example only, and not limitation.

For example, while the invention has been described in terms of particular linewidth control parameters, one skilled in the art would recognize that the instant invention could be applied to any desired linewidth control parameter. It will be understood by those skilled in the art that various changes in form and details can be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A method of linewidth optimization within a lithographic system comprising the steps of:
   (a) printing lines for various points within a slot;
   (b) selecting a linewidth control parameter;
   (c) determining focus offset coefficients for said linewidth control parameter based on said printed lines;
   (d) grouping predetermined ones of said focus offset coefficients to form a set of said focus offset coefficients; and
   (e) controlling multiple focus points within said slot based on said set of said focus offset coefficients.

2. The method of claim 1, wherein said step (b) further comprises the step of selecting a linewidth control parameter from the group of linewidth control parameters consisting of H-V bias, G-I bias, and CD through-focus.

3. The method of claim 1, wherein said step (b) further comprises the step of selecting a plurality of linewidth control parameters for optimization.

4. The method of claim 1, wherein said step (e) further comprises the step of flexing the surface of a flexible chuck to perform said controlling of said multiple focus points within said slot being scanned in the lithographic system.

5. The method of claim 1, further comprising the step of calibrating one of a lithographic apparatus, a reticle, and a lithographic apparatus with reticle.

6. The method of claim 5, wherein said calibrating step further comprises the step of printing a field through-focus.

7. The method of claim 5, wherein said calibrating step further comprises the step of using an aerial image monitor to determine linewidths through-focus for a slot.

8. The method of claim 1, wherein said controlling step further comprises the step of flexing a surface of a flexible chuck to perform said controlling of said multiple focus points within said slot along a scanning direction.

9. The method of claim 8, wherein said flexing of said surface of said flexible chuck is performed while said slot is being scanned.

10. A method of generating sets of focus offset coefficients for use in a lithographic system comprising the steps of:
    (a) calibrating one of a lithography apparatus, reticle, and lithography apparatus having a reticle;
    (b) printing lines for various points within a slot;
    (c) determining the focus offset coefficients for said lines; and
    (d) grouping predetermined ones of said focus offset coefficient to form the set of the focus offset coefficients.

11. The method of claim 10, wherein said step (c) comprises one of:
    (i) using plotted curves that are based on data gathered from step (b) to perform said determining step; and
    (ii) using a computation device or element to process data based on step (b) to perform said determining step.

12. The method of claim 10, wherein said step (c) further comprises the step of measuring linewidths of said printed lines.

13. The method of claim 12, wherein said step of measuring linewidths comprises optically measuring linewidths.

14. The method of claim 12, wherein said step of measuring linewidths comprises measuring linewidths with electrical probes.

15. The method of claim 10, further comprising the steps of printing fields at a known focus setting and determining focus offset coefficients for slot locations along a scanning direction.

* * * * *